United States Patent

Hynecek

[11] Patent Number: 5,424,223
[45] Date of Patent: Jun. 13, 1995

[54] BULK CHARGE MODULATED DEVICE PHOTOCELL WITH LATERAL CHARGE DRAIN

[75] Inventor: Jaroslav Hynecek, Richardson, Tex.

[73] Assignee: Texas Instruments Incorporated, Dallas, Tex.

[21] Appl. No.: 254,224

[22] Filed: Jun. 6, 1994

Related U.S. Application Data

[62] Division of Ser. No. 124,735, Sep. 21, 1993, Pat. No. 5,341,008.

[51] Int. Cl.$^6$ .................... H01L 31/18; H01L 21/265; H01L 21/70
[52] U.S. Cl. .......................................... 437/3; 437/53; 437/41
[58] Field of Search .................. 437/53, 3, 181, 41

[56] References Cited

U.S. PATENT DOCUMENTS

| | | | |
|---|---|---|---|
| 4,642,877 | 2/1987 | Garner et al. | 437/53 |
| 4,900,688 | 2/1990 | Halvis | 437/41 |
| 4,906,584 | 3/1990 | Blouke et al. | 437/53 |
| 5,134,087 | 6/1992 | Mynecek | 437/53 |
| 5,246,875 | 9/1993 | Shinji et al. | 437/3 |
| 5,260,228 | 11/1993 | Taguchi | 437/53 |
| 5,288,651 | 2/1994 | Nakazawa | 437/53 |
| 5,290,722 | 3/1994 | Mynecek | 437/53 |

Primary Examiner—Brian E. Hearn
Assistant Examiner—Leon Radomsky
Attorney, Agent, or Firm—Alan K. Stewart; Richard L. Donaldson; William E. Hiller

[57] ABSTRACT

The semiconductor image sensor element comprises a transistor gate potential well 102, a virtual potential well 100 adjacent the transistor gate potential well 102, a clear gate barrier 104 adjacent the virtual potential well 100, a clear drain 30 adjacent the clear gate barrier 104, and a charge sensor 28 for sensing charge levels in the transistor gate potential well 102. The charge levels are responsive to light incident on the device. Charge is stored in the virtual potential well 100 during charge integration. After charge integration, the charge is transferred into the transistor gate potential well 102 from the virtual potential well 100 for charge detection by the charge sensor 28. After charge detection, the charge is transferred from the transistor potential well 102 to the clear drain 30.

4 Claims, 3 Drawing Sheets

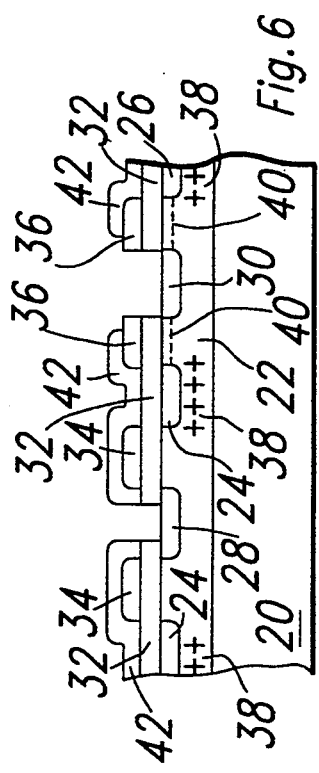
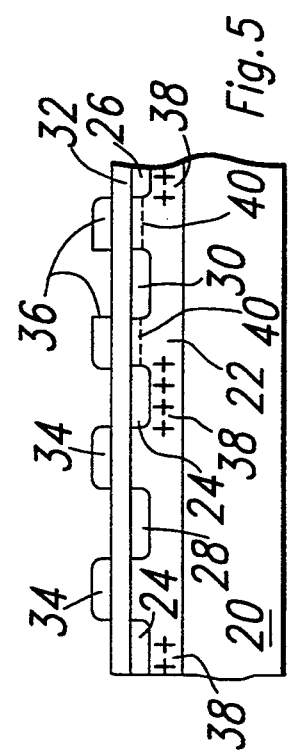
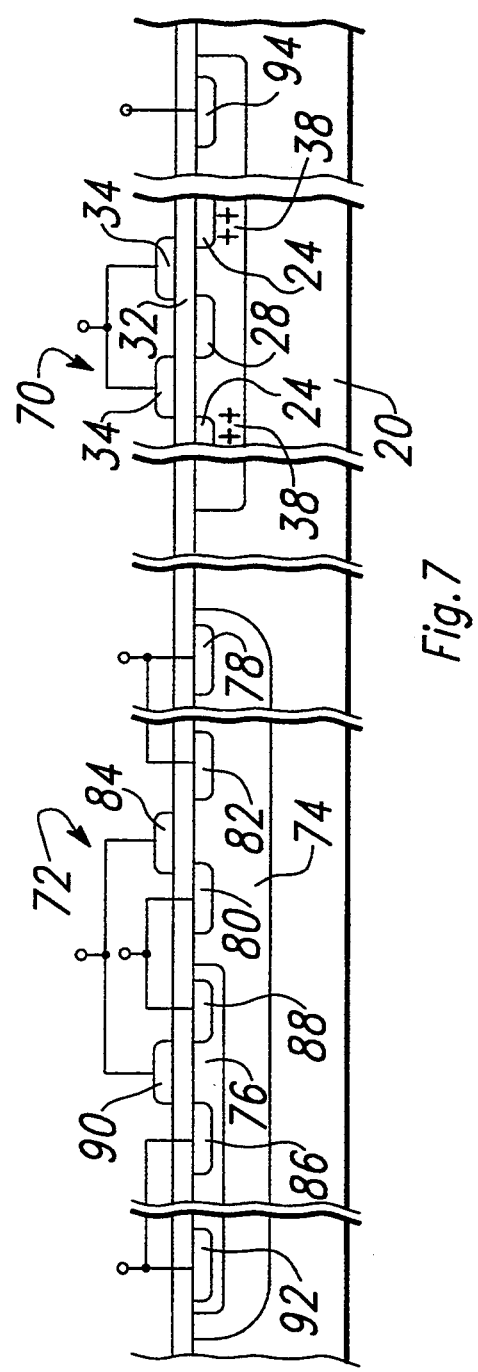

BULK CHARGE MODULATED DEVICE PHOTOCELL WITH LATERAL CHARGE DRAIN

This is a Divisional of application Ser. No. 08/124,735, filed Sep. 21, 1993, now U.S. Pat. No. 5,341,008.

FIELD OF THE INVENTION

This invention generally relates to image sensor devices, and more particularly relates to bulk charge modulated image sensors.

BACKGROUND OF THE INVENTION

Without limiting the scope of the invention, its background is described in connection with bulk charge modulated device (BCMD) image sensors, as an example. A BCMD photocell is a device used in high performance image sensors for conversion of photon generated charge to an output signal. The photocell is a MOS phototransistor that has a potential well formed under the transistor channel. When the MOS phototransistor is illuminated, photogenerated charges are stored in the potential well. As charge accumulates in this potential well, the transistor threshold is modulated. This modulation is detected by a suitable signal processing circuit. The circuit is sensitive only to the threshold changes caused by light. This is important for elimination of random cell-to-cell fixed pattern noise otherwise induced by the fixed transistor threshold variations.

A typical prior art BCMD photocell has a vertical overflow drain. This device is described in Hynecek, J, "Bulk Charge Modulated Transistor Threshold Image Sensor Elements and Method of Making", U.S. Pat. No. 4,901,129, issued Feb. 13, 1990. The typical prior art device is reset by pulsing the gate voltage so that the charge flows out of the charge well down to the substrate.

SUMMARY OF THE INVENTION

It has been discovered that a whole sensor reset in a bulk charge modulated device (BCMD) with a vertical overflow drain is difficult to accomplish.

Generally, and in one form of the invention, the semiconductor image sensor element comprises a transistor gate potential well, a virtual potential well adjacent the transistor gate potential well, a clear gate barrier adjacent the virtual potential well, a clear drain adjacent the clear gate barrier, and a charge sensor for sensing charge levels in the transistor gate potential well. The charge levels are responsive to light incident on the device. Charge is stored in the virtual potential well during charge integration. After charge integration, the charge is transferred into the transistor gate potential well from the virtual potential well for charge detection by the charge sensor. After charge detection, the charge is transferred from the transistor gate potential well to the clear drain.

This invention provides several advantages. One advantage is easier fabrication and process parameter control. The photocell is built in bulk substrate not in a CMOS well. Another advantage is higher sensitivity and good infra-red response. Another advantage is that surface dark current generation is suppressed by negative gate bias. Another advantage is whole sensor reset capability. This is important for still picture application or strobe illumination. Another advantage is the superior linear light response due to the elimination of the vertical overflow drain structure. Another advantage is that the channel stop contact to the photocell is through the substrate, which minimizes interconnects to the photocell. Another advantage is that the nested well CMOS makes it possible to apply negative gate bias to the photocell and still have the photocell built in the bulk substrate.

BRIEF DESCRIPTION OF THE DRAWINGS

In the drawings:

FIGS. 4-6 show the device of FIG. 2 at three stages of fabrication;

FIG. 7 is a cross-section of a portion of the device of FIG. 2 along with a CMOS device;

Corresponding numerals and symbols in the different figures refer to corresponding parts unless otherwise indicated.

DETAILED DESCRIPTION OF PREFERRED EMBODIMENTS

Figure 1:
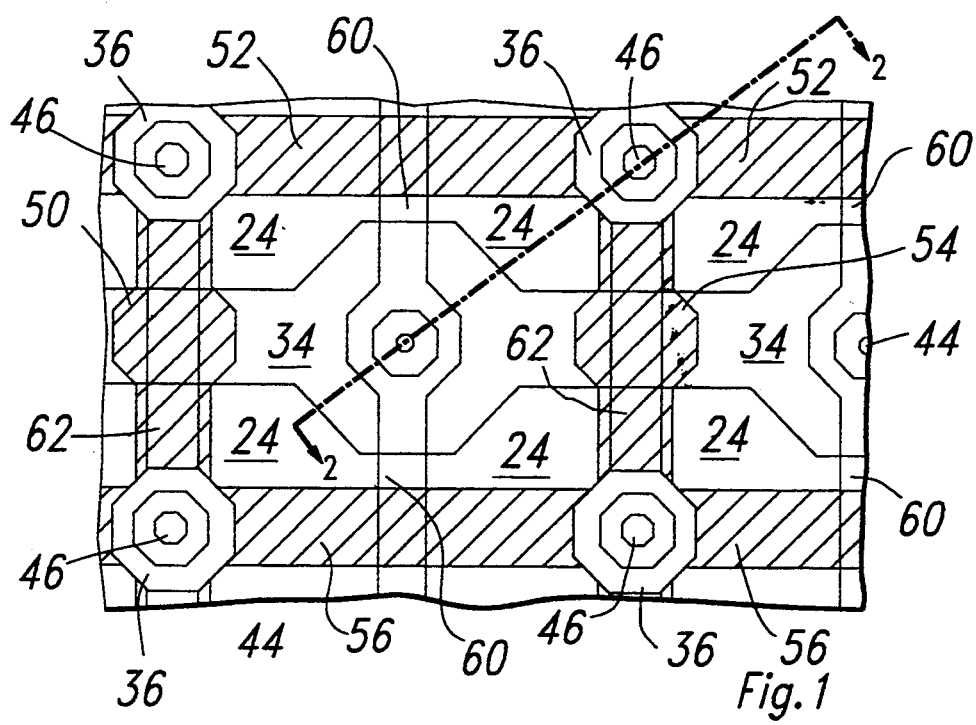
FIG. 1 is a plan view of a fragment of an image array containing a first preferred embodiment bulk charge modulated device (BCMD) photocell with lateral charge drain.

Referring to FIG. 1, a plan view of a first preferred embodiment bulk charge modulated device (BCMD) photocell with lateral charge drain is shown. The photocell is formed at a face of a P type semiconductor substrate or layer. The photocell is surrounded by a plurality of similar photocells arranged in a plurality of rows and columns. The semiconductor layer is preferably a semiconductor substrate, but can take other forms such as an epitaxial layer.

The photocell preferably has an enclosed architecture, although other, more complicated isolation techniques can be employed in fabricating a photocell according to the invention. Each photocell has an enclosing P+ doped region 24 formed in an N type layer in the substrate. P+ doped region 24 forms the drain of a MOS transistor. Each photocell further has a transistor gate 34 surrounded by the P+ drain 24. The transistor gate 34 surrounds the source electrode 44 which is connected to other source electrodes (not shown) in the same column by conductor 60. The drain 24 is surrounded by channel stop regions 50, 52, 54, and 56, and lateral charge drains. The lateral charge drains consist of clear drain electrode 46 and clear gate 36. Each clear drain electrode 46 is connected to other clear drain electrodes in the same column by conductor 62.

Figure 2:
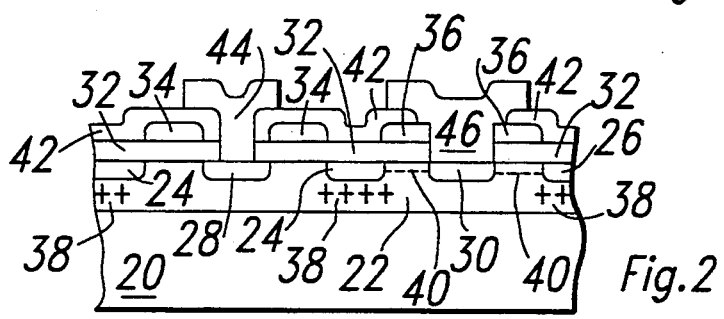
FIG 2 is a cross-section of a first preferred embodiment BCMD photocell with lateral charge drain

FIG. 2 is a cross-section of the first preferred embodiment BCMD photocell with lateral charge drain. The structure of FIG. 2 includes a P type silicon substrate 20, an N type layer 22 in the substrate 20, P+ drain regions 24 and 26 formed in the upper portion of N type layer 22, P+ source 28 formed in the upper portion of N type layer 22, N+ clear drain (lateral drain) 30, gate insulator layer 32, transistor gate 34, clear gate 36, virtual well donor implants 38 in the N type layer 22, threshold adjust implant 40 below the clear gate 36, insulator layer 42, source electrode 44, and clear drain electrode 46.

Figure 4:
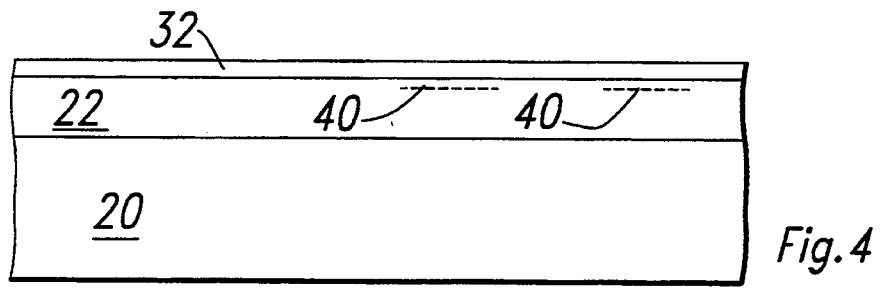

FIGS. 4–6 illustrate successive steps in a process for fabricating a BCMD photocell with lateral charge drain according to the preferred embodiment, as shown in FIG. 2. Referring first to FIG. 4, an N type layer 22 is formed in P type semiconductor substrate 20. N type layer 22 may be formed by ion implantation. A dopant such as phosphorus may be used as the implant dopant. Next, the channel stop regions 50, 52, 54, and 56, shown in FIG. 1, are formed. Then a gate insulator layer 32 is formed over the surface of the device. The gate insulator layer 32 is preferably formed of oxide and may be grown from the substrate. Next, a photoresist layer is used to pattern an implant into N type layer 22 to form the threshold adjust implants 40 (acceptor implants) shown in FIG. 4. This implant is done with a P type dopant such as boron. By using the threshold adjust implant 40 under the clear gate, the clear drain electrode 46 and the clear gate 36 can be connected together as shown in FIG. 2.

After the photoresist layer is stripped, the transistor gate 34 and the clear gate 36 are deposited, doped to be conductive, patterned, and etched, as shown in FIG. 5. The transistor gate 34 and clear gate 36 are formed over the insulator layer 32. The gates 34 and 36 are formed of a relatively refractory, conductive, and at least light-translucent layer, such as doped polysilicon or, more preferably, doped tin oxide. For polysilicon gates, from 500 to 5000 Angstroms of a polysilicon layer is deposited, doped, patterned, and etched to form gates 34 and 36. The polysilicon gates may be doped in place by a dopant such as phosphoric oxytrichloride ($POCl_3$).

In place of polysilicon, gates 34 and 36 can be formed of tin oxide. A tin oxide layer may be deposited by a forced-plasma low-pressure chemical vapor deposition in a plasma reactor. Tetramethyltin and carbon dioxide can be used as the gas reactants in order to deposit the tin oxide layer. To render the tin oxide layer conductive, the reacting gas can contain a small amount of phosphoric oxytrichloride (POCL3) or phosphorous trichloride (PCl3) in the reactant mixture. The tin oxide layer may be patterned using an oxide mask and etched using hydrogen iodide as entrained onto the gas flow of an inert gas such as nitrogen. The etch should take place at a temperature below 450 degrees C. Doped tin oxide is a preferred conductor material because of its high transparency relative to polysilicon. Further, it is highly resistant to subsequent annealing, etching, and oxidation steps.

After the gates 34 and 36 are patterned and etched, they can be used in a self-aligned process as a mask for implantation of P+ source 28, P+ drains 24, and 26, and N+ clear drain 30. First, P+ source 28, and P+ drains 24 and 26 are patterned using photoresist. Then a dopant such as boron is implanted into N type layer 22 to form the P+ regions 24, 26, and 28, shown in FIG. 5. After the photoresist layer is stripped, another photoresist layer is used to pattern an implant into N type layer 22 to form N+ clear drain 30, shown in FIG. 5. This implant is done with an N type dopant such as phosphorous or arsenic. Then a photoresist layer may be used to pattern an implant to form the donor implants 38 shown in FIG. 4. The donor implants 38 are also made in a self aligned manner. This implant is done with an N type dopant such as phosphorous.

Then an insulator layer 42 is formed over the surface of the structure. Insulator layer 42 can be formed of oxide. Next, contact openings to the source 28 and to the clear drain 30 are patterned and etched through the two insulator layers 32 and 42, as shown in FIG. 6. The contact opening to the clear drain is etched such that the clear drain electrode 46 will be in contact with the clear gate 36. Then a conductive layer is deposited and etched to form source electrode 44 and clear drain electrode 46, as shown in FIG. 2.

To keep the infra-red response it is important to build the photocell array in the bulk material not in the well. This requirement represents a problem for peripheral CMOS circuits. The photocell gate needs to be clocked negative with respect to substrate. One solution of this problem is to use a nested well CMOS process, as shown in FIG. 7. The structure of FIG. 7 includes P type substrate 20, a BCMD photocell 70 with P+ region 94, and a CMOS structure 72 which includes N well 74, P well 76, N+ region 78, P+ regions 80 and 82 which form the source and drain of a P channel MOSFET, gate 84 which forms the gate of the P channel MOSFET, N+ regions 86 and 88 which form the source and drain of an N channel MOSFET, gate 90 which forms the gate of the N channel MOSFET, and P+ region 92.

The P well 76 is fabricated inside of the N well 74. This allows the output to swing both positive and negative with respect to the substrate. For example, in the preferred embodiment, the voltage can swing from +5 volts to −5 volts with respect to the substrate. The voltage sources are connected to the P+ regions 78 and 94 and the N+ region 92.

The operation of the device of FIGS. 1 and 2 is described below and is illustrated by the potential profile shown in FIG. 3, directly below the corresponding regions of the device of FIG. 2. These regions are given the following names: P+ regions 24 and 26 are called virtual gates (or virtual electrodes) and also serve as a drain for the active transistor, the regions below the P+ regions 24 and 26 are called virtual wells, the region below the transistor gate 34 is the transistor gate well, and the region below the clear gate 36 is the clear gate barrier.

Figure 8:
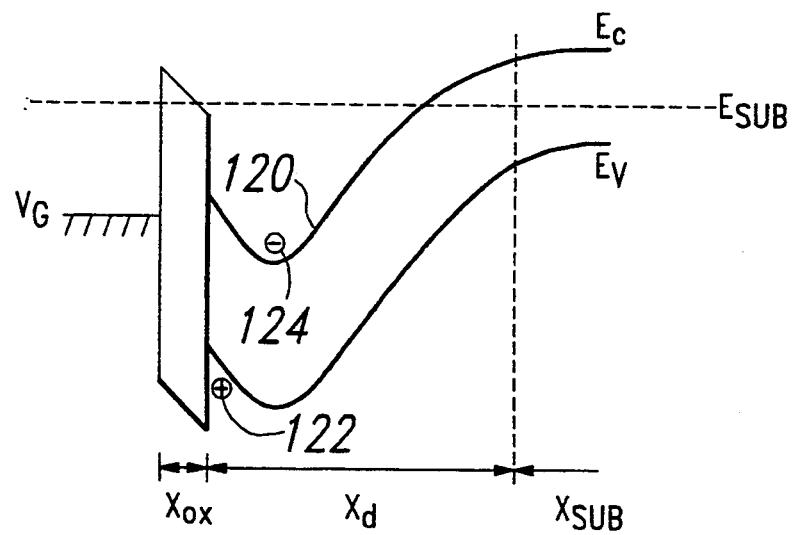
FIG. 8 is a potential band diagram of the first preferred embodiment BCMD photocell with lateral charge drain.

Referring now to FIG. 8, a potential band diagram of the device of FIG. 2 is illustrated. $V_G$ represents the applied transistor gate bias. The two curves are the potential curves for the conduction band $E_c$ and the valence band $E_v$ of the semiconductor substrate at the photosite gate region. The distance $X_{OX}$ represents the insulator layer 32. The distance $X_d$ represents the depletion region. The distance $X_{sub}$ represents the undepleted substrate. The curves show an electron potential well 120 formed a substantial distance into the semiconductor layer and hole current channel 122 which is near the surface. If light is allowed to enter the structure of the invention, the electrons 124 generated in the substrate will be collected in potential well 120. This conduction band $E_C$ allows the collection of charge created by lower frequency light such as infra-red which generates charge deeper in the substrate than higher frequency light.

During charge integration the transistor gate 34 is biased negative to accumulate holes at the semiconductor-insulator interface. This quenches the interface states and significantly reduces the interface generated dark current. During the integration period, charge accumulates in the virtual well 100 surrounding the transistor well 102 shown in FIG. 3. When the charge integration is completed, the transistor gate 34 is biased higher such that the transistor gate well 102 is at a higher potential than the virtual well 100. Then the charge which has accumulated in the virtual well 100 is transferred into the transistor gate well 102. The transistor threshold is changed according to the amount of charge accumulated in the transistor gate well 102. This threshold change is sensed at the source 28. After the sensing is completed, signal charge is transferred out of the transistor gate well 102 by pulsing the transistor gate 34 negative. Charge is transferred out of the transistor gate well 102 into the virtual well 100. Then the clear drain 30 and the clear gate 36 are biased more positive such that the potential level of the clear gate barrier 104 is higher than the virtual well 100. This allows the charge in the virtual well 100 to flow across the clear gate barrier 104 and out through the clear drain 30.

Figure 3:
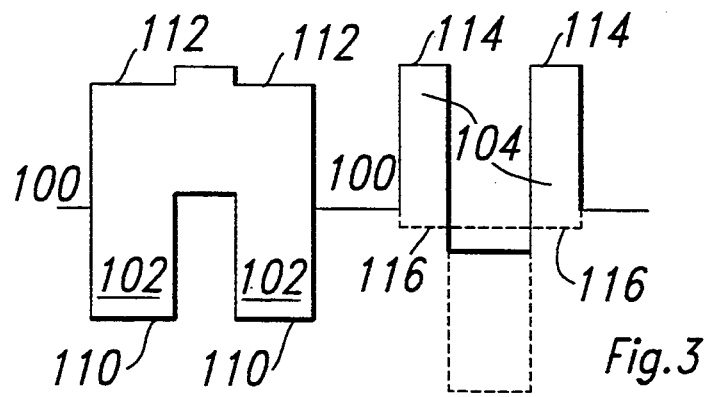
FIG. 3 is a diagram of the potential wells created by the device of FIG. 2.

A more detailed description of the operation of the device of FIG. 2 is explained by referring to the potential profile shown in FIG. 3. The energy levels for an electron in the various regions of the device and for different bias levels of the transistor gate 34, and different bias levels of the clear gate 36 and clear drain 30 are shown in FIG. 3. Starting with an electron in the virtual well 100 with the transistor gate biased negative, the operation is as follows. First, during charge integration, the electron falls into the virtual well 100. The electron will remain in the virtual well 100 as long as the transistor gate well 102 and the clear gate barrier 104 are at a more negative potential than the virtual well 100. During the integration time, all the transistor gates are biased negative to accumulate holes to the semiconductor-insulator interface and suppress the dark current generation. When the transistor gate well 102 is switched to a more positive bias with respect to the virtual well 102, the potential level of the transistor gate well 102 changes to level 110 from level 112. As a result, the electron passes from the virtual well 100 to the transistor gate well 102 at level 110. The presence of charge is then detected by sensing the potential at the source 28.

For reset, the transistor gate bias returns to a more negative voltage which changes the potential level of transistor gate well 102 from level 110 to level 112. As a result, the electron passes from the transistor gate well 102 to the virtual well 100. Then the clear drain bias is switched to a more positive level such that the clear gate barrier 104 changes from potential level 114 to level 116. The electron then moves across the clear gate barrier 104 and into the clear drain 30, where it is removed. Charge removal from the transistor gate well 102 and the virtual well 100 resets the photocell for the next charge integration period. This reset process provides a complete charge removal from the structure because there is no charge remaining in the transistor well 102 or virtual well 100 after the charge is transferred to the clear drain 30.

Figure 9:
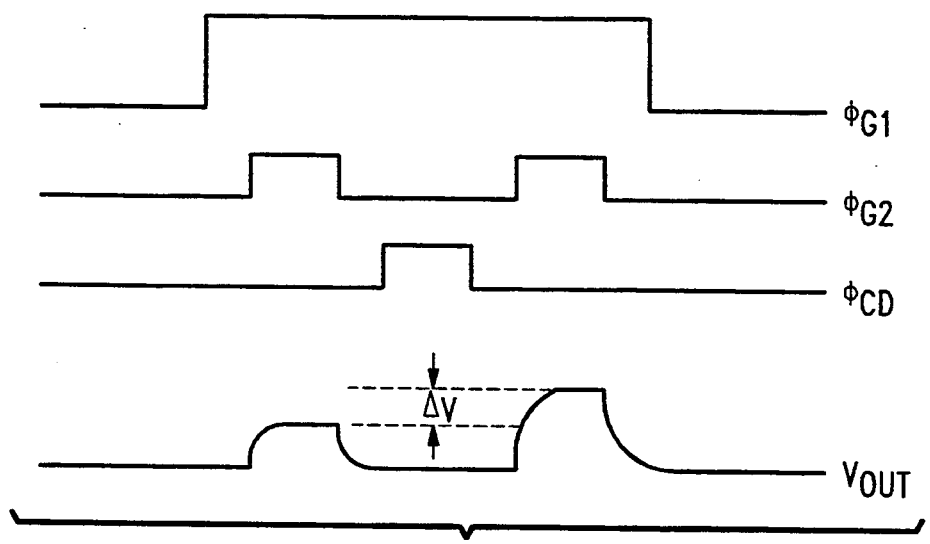
FIG. 9 is a wave form diagram of the inputs and the output of the device of FIG. 2.

For an array of photocells with many cells connected to a signal column line, the horizontal blanking interval signals shown in FIG. 9 are applied to the array. $\phi_{G1}$ is the input signal for the transistor gates of the nonaddressed photocells, $\phi_{G2}$ is the input signal for the transistor gates of the addressed photocells, $\phi_{CD}$ is the input signal for the clear drain, $V_{out}$ is the output signal at the source, and $\Delta V$ is the difference between the output voltage $V_{out}$ when charge is in the transistor gate well and the output voltage $V_{out}$ when charge has been cleared from the transistor gate well. The $\Delta V$ signal is read to eliminate the fixed pattern noise due to the transistor threshold variations.

Referring to FIG. 9, the timing cycle starts with an integration period to allow incident light to generate charge in the photocells. The charge is collected in the virtual wells, as described above. Before readout begins, the transistor gates of the nonaddressed photosites are biased at a high voltage for the horizontal blanking interval, as shown by $\phi_{G1}$. Next, the transistor gate for the addressed photosite is switched to a higher voltage, which is less than the voltage on the nonaddressed gates, as shown by $\phi_{G2}$. Then the output signal is read out through the source. After readout, the bias $\phi_{G2}$ for the addressed transistor gate is lowered. Then the clear drain bias $\phi_{CD}$ is switched to a higher voltage to clear the charge from the photosite. After the charge is cleared, the clear drain bias $\phi_{CD}$ is lowered. Then the bias $\phi_{G2}$ of the addressed photosite gate is switched to the previous higher bias level. The output signal is readout from the source once again for the $\Delta V$ measurement.

This invention provides several advantages. One advantage is easier fabrication and process parameter control. The photocell is built in bulk substrate not in a CMOS well. Another advantage is higher sensitivity and good infra-red response. Another advantage is that surface dark current generation is suppressed by negative gate bias. Another advantage is whole sensor reset capability. This is important for still picture application or strobe illumination. Another advantage is the superior linear light response due to the elimination of the vertical overflow drain structure. Another advantage is that the channel stop contact to the photocell is through the substrate, which minimizes interconnects to the photocell. Another advantage is that the nested well CMOS makes it possible to apply negative gate bias to the photocell and still have the photocell built in the bulk substrate.

A few preferred embodiments have been described in detail hereinabove. It is to be understood that the scope of the invention also comprehends embodiments different from those described, yet within the scope of the claims.

For example, all conductivity types may be reversed. The photocell transistor may be N channel instead of P channel and all elements of the structure would have similarly reversed conductivity types.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an image sensing device comprising:

forming a semiconductor substrate of a first conductivity type;

forming a semiconductor layer of a second conductivity type in the substrate;

forming a transistor drain region of the first conductivity type in the semiconductor layer, the transistor drain region forming a virtual gate;

forming a transistor source region of a first conductivity type in the semiconductor layer and spaced apart from the transistor drain region and surrounded by the transistor drain region;

forming a clear drain region of a second conductivity type in the semiconductor layer and spaced apart from the transistor drain region and on the opposite side of the transistor drain region than the transistor source region;

forming an insulating layer on the semiconductor layer;

forming a transistor gate on the insulating layer, the transistor gate is located above a portion of the semiconductor layer that surrounds the transistor source region and is surrounded by the transistor drain region, the transistor gate forming a transistor gate potential well for carriers of the second conductivity type;

forming a clear gate on the insulating layer, the clear gate is located above a portion of the semiconductor region that is between the transistor drain region and the clear drain region, the clear gate forming a clear gate barrier between the transistor source region and the clear drain region.

2. The method of claim 1 wherein the semiconductor substrate is P type and the semiconductor layer is N type.

3. The method of claim 1 wherein the transistor drain region and the transistor source region are P+ type, and the clear drain region is N+ type.

4. The method of claim 1 wherein the clear gate and the transistor gate are polysilicon.

* * * * *